United States Patent
Anemikos et al.

(10) Patent No.: US 7,877,714 B2
(45) Date of Patent: Jan. 25, 2011

(54) SYSTEM AND METHOD TO OPTIMIZE SEMICONDUCTOR POWER BY INTEGRATION OF PHYSICAL DESIGN TIMING AND PRODUCT PERFORMANCE MEASUREMENTS

(75) Inventors: Theodoros E. Anemikos, Milton, VT (US); Jeanne P. Spence Bickford, Essex Junction, VT (US); Laura S. Chadwick, Essex Junction, VT (US); Susan K. Lichtensteiger, Essex Junction, VT (US); Anthony D. Polson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 339 days.

(21) Appl. No.: 12/038,320

(22) Filed: Feb. 27, 2008

(65) Prior Publication Data

US 2009/0217221 A1    Aug. 27, 2009

(51) Int. Cl.
*G06F 17/50* (2006.01)
(52) U.S. Cl. .............................................. 716/4; 716/2
(58) Field of Classification Search .................. 716/4–6, 716/2, 18
See application file for complete search history.

(56) References Cited

U.S. PATENT DOCUMENTS

| 7,475,366 B2 * | 1/2009 | Kuemerle et al. | 716/1 |
| 7,627,836 B2 * | 12/2009 | Culp et al. | 716/2 |
| 2005/0107967 A1 | 5/2005 | Patel et al. | |

* cited by examiner

*Primary Examiner*—Jack Chiang
*Assistant Examiner*—Binh C Tat
(74) *Attorney, Agent, or Firm*—Richard Kotulak; Roberts Mlotkowski Safran & Cole, P.C.

(57) ABSTRACT

A system and method is provided for optimizing semiconductor power by integration of physical design timing and product performance measurements. The method includes: establishing a timing run and identifying a sigma code for the timing run; establishing ring oscillator bins and respective code; identifying a required timing run for a second level assembly to satisfy a selected voltage bin; timing a product using the required timing run; testing a ring oscillator of the product using the timing to obtain physical design identification; recording the physical design identification and the sigma code for the timing run; and using the recorded physical design identification and the sigma code to set a voltage for the product to optimize power.

7 Claims, 2 Drawing Sheets

SYSTEM AND METHOD TO OPTIMIZE SEMICONDUCTOR POWER BY INTEGRATION OF PHYSICAL DESIGN TIMING AND PRODUCT PERFORMANCE MEASUREMENTS

FIELD OF THE INVENTION

The invention relates to a system and method of optimizing semiconductor power by integration of physical design timing and product performance measurements.

BACKGROUND DESCRIPTION

The manufacture of integrated circuits (IC) is becoming ever more complicated as finer and finer geometries are designed into today's semiconductor ICs. For example, as manufacturing processes become more complex over time due to finer geometries, the leakage component of the chip power increases, which can become problematic for next level assembly and at system level. By way of example, leakage component of chip power was about 10-20% of total power at 130 nm and 25-50% of total power at 90 nm; whereas, in current 65 nm technology, this leakage component is upwards of 25-65% of total power.

Due to a high leakage component, semiconductor yield has been impacted by tighter iddq screens. Iddq testing is a method for testing CMOS ICs for the presence of manufacturing faults. Iddq testing uses the principle that in a correctly operating quiescent circuit, there is no static current path between the power supply and ground, except for a small amount of leakage. However, when leakage is above a certain threshold, e.g., 1x or less of estimate obtained by running a power estimating tool, these circuits have to be scrapped thus reducing overall chip yield.

The current method of selective voltage binning is a manual process which is prone to error. By way of example, leakage cutpoints (for different binning) are manually determined. Also, the design centers will apply additional timing runs at identified cutpoints which are manually used to set leakage limits. The cutpoints are used to identify the ring oscillator (speed bin) marker which is burned in fuses in the semiconductor die. However, in these current methods, the manual set is required for each semiconductor product. Also, there is potential for error in card/second level assembly. Additionally, there may be no flag if the bin information is applied incorrectly and does not match product design assumptions. Lastly, amongst other possible shortcomings, there is no opportunity to update the criteria at a later stage in processing.

Accordingly, there exists a need in the art to overcome the deficiencies and limitations described hereinabove.

SUMMARY OF THE INVENTION

In a first aspect of the invention, a method optimizing semiconductor power by integration of physical design timing and product performance measurements, comprises: establishing a timing run and identifying a sigma code for the timing run; establishing ring oscillator bins and respective code; identifying a required timing run for a second level assembly to satisfy a selected voltage bin; timing a product using the required timing run; testing a ring oscillator of the product using the timing to obtain physical design identification; recording the physical design identification and the sigma code for the timing run; and using the recorded physical design identification and the sigma code to set a voltage for the product to optimize power.

In embodiments, the identification of the timing run and the ring oscillator bins and respective code are compared to determine which oscillator bin to use for a particular timing run. The timing runs are identified by performance bin codes for the technology (e.g., exemplary ½ sigma bins). The physical design identification and the sigma code are burned into a fuse. The using comprises matching the recorded physical design identification and the sigma code to the established and identified sigma code for the timing run and the established ring oscillator bins and respective code to set the voltage.

In another aspect of the invention, a system of optimizing semiconductor power by integration of physical design timing and product performance measurements, comprises a computer infrastructure operable to: establish identification performance bin codes and timing run codes; record a performance code at device test; record a timing code at device test; and match the identification performance bin codes and timing run codes to the recorded performance code and timing code in order to adjust a voltage on card to an established timing code level using the established identification performance bin code and code for each identified timing run.

BRIEF DESCRIPTION OF THE DRAWINGS

The present invention is described in the detailed description which follows, in reference to the noted plurality of drawings by way of non-limiting examples of exemplary embodiments of the present invention, in which.

DETAILED DESCRIPTION OF EMBODIMENTS OF THE INVENTION

The invention relates to a system and method of optimizing semiconductor power by integration of physical design timing and product performance measurements into the chip, itself. The invention advantageously provides performance/power sorting at the IC (integrated circuit) manufacturer site, if required, without the need for manual binning. By implementing the system and method of the invention, it is possible to provide integration of semiconductor design assumptions and manufacturing process data that can be used by card/second level assembly to optimize card/second level assembly power and system level power through the use of information contained in the die that is accessible at card build time.

The semiconductor design assumptions and manufacturing process data can be used to select voltage levels for card/second level assembly and avoid card yield loss and/or reliability issues associated with yield loss to product and manufacturing engineering teams. As such, by implementing the invention, yield loss is reduced as selective voltage binning can be used on more products. Also, in implementation, the invention avoids second level assembly applying incorrect voltage (functionality) to the assembly, e.g., including the chip. The system and method of the invention can be used on any semiconductor integrated circuit product.

In embodiments, elements of the invention include identifying each performance/power bin code for technology (e.g., exemplary ½ sigma bins) and establishing a code for each performance/power bin code. The invention also identifies timing runs to satisfy each performance/power bin and establishes a code for each of the timing runs. After test, the performance/power bin code for technology (e.g., exemplary ½ sigma bins) can be burned into the fuses of each product. At the design level of the semiconductor product, the timing code identifier is recorded and passed to test through a test program or other mechanism. At the test level, the performance/power code is recorded (burned into the fuse) for the second level assembly processes. Similarly, the timing code (for test) is recorded (burned into the fuse) for the second level assembly processes. At second level assembly, the performance/power and timing code identifiers can be read and the voltage adjusted on the card to the timing code allowed levels using the performance/power data. This process can be applied to match any physical design/card build constraints (e.g., performance, timing closed at negative slack, etc.)

Exemplary Environment for Implementing Aspects of the Invention

Figure 1:
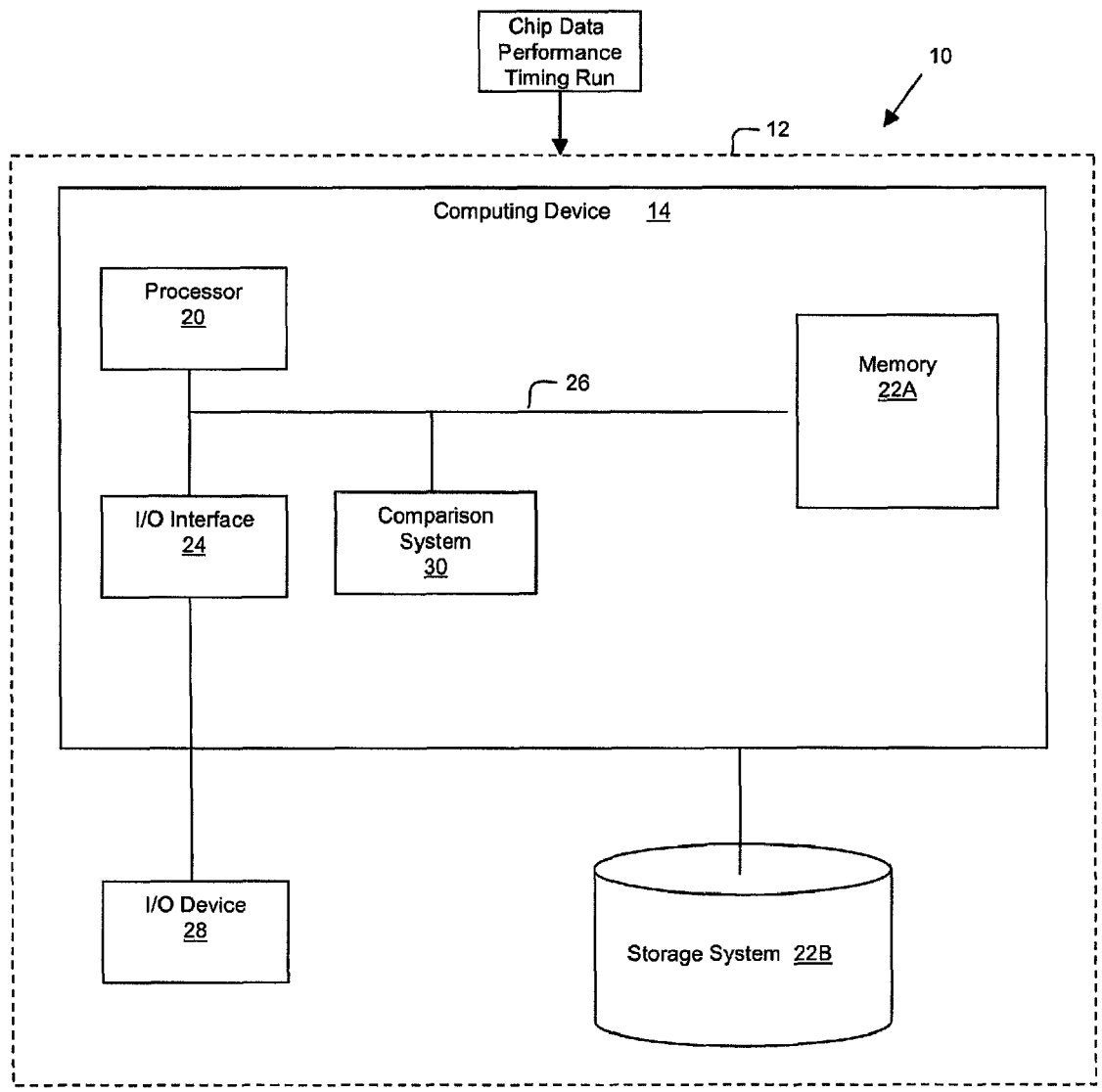
FIG. 1 illustrates an environment for implementing the processes of the invention.

FIG. 1 shows an illustrative environment 10 for managing the processes in accordance with the invention. To this extent, the environment 10 includes a computer infrastructure 12 that can perform the processes described herein. In particular, the computer infrastructure 12 includes a computing device 14 that comprises a comparison system 30, which makes computing device 14 operable to match chip performance/power (e.g., recorded timing run data and ring oscillator data) to a required card level performance/power in order to optimize a higher level assembly in accordance with the invention, e.g., process described herein.

The computing device 14 includes a processor 20, a memory 22A, an input/output (I/O) interface 24, and a bus 26. The memory 22A can include local memory employed during actual execution of program code, bulk storage, and cache memories which provide temporary storage of at least some program code in order to reduce the number of times code must be retrieved from bulk storage during execution. Further, the computing device 14 is in communication with an external I/O device/resource 28 and a storage system 22B. The I/O device 28 can comprise any device that enables an individual to interact with the computing device 14 or any device that enables the computing device 14 to communicate with one or more other computing devices using any type of communications link. For example, the external I/O device/resource 28 may be keyboards, displays, pointing devices, etc. in order to enter and display performance/power and timing run data in accordance with the invention.

In general, the processor 20 executes computer program code, which is stored in memory 22A and/or storage system 22B. While executing computer program code, the processor 20 can read and/or write data to/from memory 22A, storage system 22B, and/or I/O interface 24. The bus 26 provides a communications link between each of the components in the computing device 14.

Exemplary Processes in Accordance with the Invention

Figure 2:
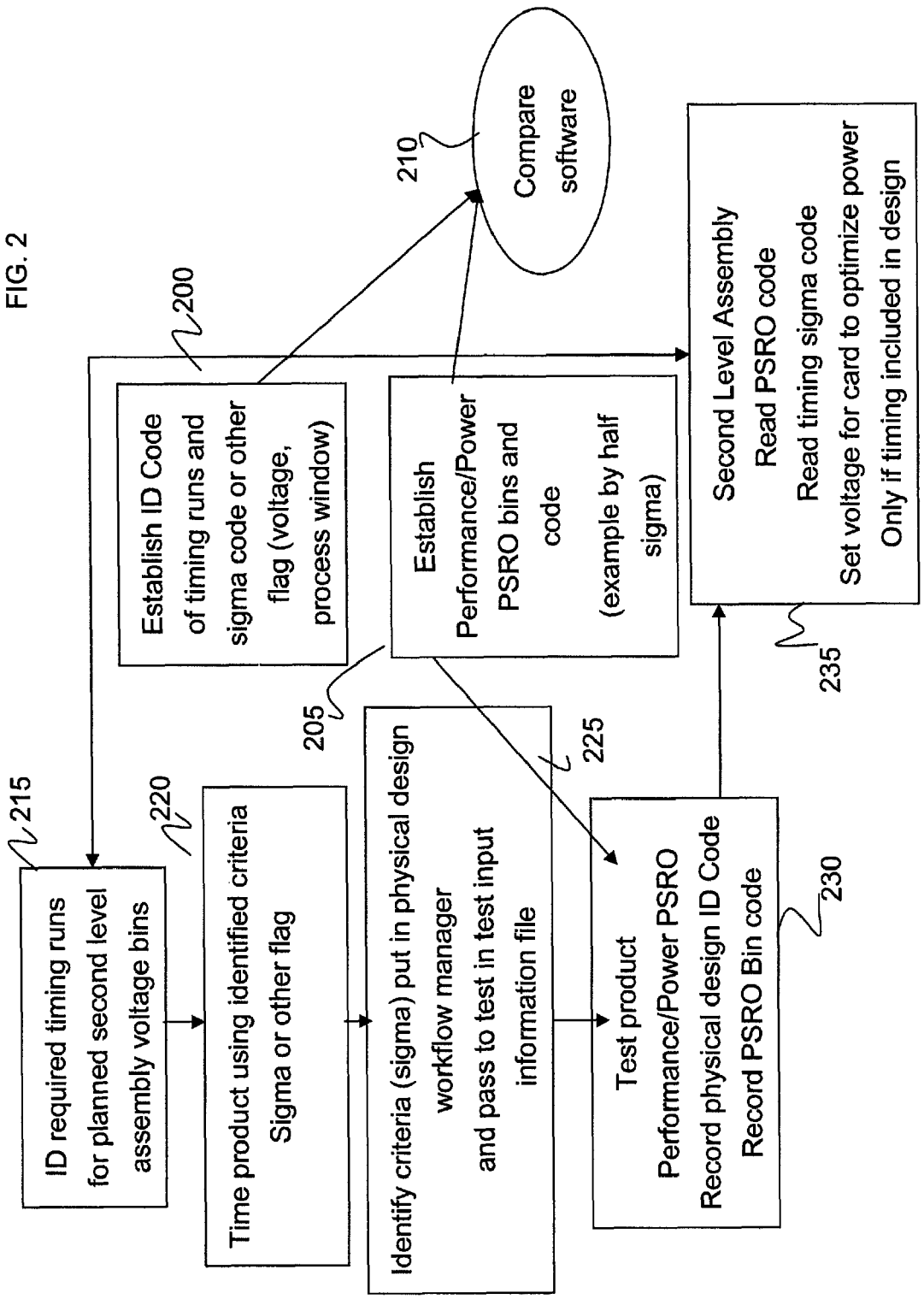
FIG. 2 is a flow diagram of a design process used in semiconductor design, manufacturing, and/or test according to aspects of the invention.

FIG. 2 is a flow diagram showing processing steps of embodiments of the invention. FIG. 2 may equally represent a high-level block diagram of components of the invention implementing the steps thereof. The steps of FIG. 2 may be implemented on computer program code in combination with the appropriate hardware. This computer program code may be stored on storage media and be implemented on the computer infrastructure of FIG. 1. For the purposes of this description, a computer-usable or computer readable medium can be any apparatus that can contain, store, communicate, propagate, or transport the program for use by or in connection with the instruction execution system, apparatus, or device.

Referring to FIG. 2, at step 200, an identification of a timing run is established and a sigma code or other flag is provided for the identified timing run (voltage, process code). In embodiments, the timing run can be identified by performance/power bin codes for the technology (e.g., exemplary ½ sigma bin codes). As should be understood by those of skill in the art, timing runs are provided by tools which are configured to input a signal into a circuit and analyze the output to determine that the output is within certain parameters, e.g., is at a designed output within a certain time period. In embodiments, the establishment of the identification code of the timing runs allows a set number of timing runs to be identified and established for use in the optimization process of higher level assemblies. This acquired information can be burned into each chip, after test, to assist in optimizing performance/power of the higher level assembly. At step 205, the ring oscillator bins and codes are established for the chip. In embodiments, the identification code can be broken down in ½ sigma limits or other desired code.

At step 210, the identification of the timing run, e.g., sigma code, and the ring oscillator bins code are compared. This comparison will determine which oscillator bin to use for a particular timing run. This comparison can be accomplished using the infrastructure shown in FIG. 1.

At step 215, a required timing run for a second (or higher) level assembly is identified to satisfy a selected voltage bin. At step 220, the product is timed using the content that is underneath the identified and established code of the timing runs, sigma or other flag. At step 225, the criteria (e.g., sigma) are identified and the physical design is provided to a workflow manager and passed to test in a test input information file. For example, at step 225, the identification code (sigma code or flag) is passed to the product design and passed to test in a test input file. At step 230, the ring oscillator is tested and the ring oscillator performance information with the identification code of the timing run is recorded, e.g., burned into the fuse.

At step 235, at a second level assembly, the recorded ring oscillator information and the timing sigma code are read. At this stage, by using the ring oscillator information and the sigma code, the voltage for the card can be set to optimize the power. For example, using the oscillator code and the timing sigma code it is possible to match a ring oscillator to a card level assembly to optimize the card level assembly using the information established in steps 200 and 205. The matching can be performed using the computing infrastructure of FIG. 1. In this way, it is possible to adjust the voltage on the card to the timing code thereby optimizing power of the card assembly and in the system using the cards. Also, with this information it is no longer possible to mismatch a voltage with a product (which would result in functional field fails).

The invention also allows extended distribution to be shipped at semiconductor test (improve yield through avoiding requirement for leakage screens, as well as avoids card functionality problems. That is, as discussed above, only voltage/performance options included in timing run are allowed and the information is read directly from the chip While the invention has been described in terms of exemplary embodiments, those skilled in the art will recognize that the invention can be practiced with modifications and in the spirit and scope of the appended claims.

The invention claimed is

1. A method of optimizing semiconductor power by integration of physical design timing and product performance measurements for the design of a chip, comprising:
    establishing a timing run and identifying a sigma code for the timing run;
    establishing ring oscillator bins and respective code;
    identifying a required timing run for a level assembly to satisfy a selected voltage bin;
    timing a product using the required timing run;
    testing a ring oscillator of the product using the timing to obtain physical design identification;
    recording the physical design identification and the sigma code for the timing run; and
    using the recorded physical design identification and the sigma code to set a voltage for the product to optimize power.

2. The method of claim 1, further comprising comparing the identification of the timing run and the ring oscillator bins and respective code to determine which oscillator bin to use for a particular timing run.

3. The method of claim 1, wherein the timing runs are be identified by performance/power bin codes for technology.

4. The method of claim 1, wherein the physical design identification and the sigma code are burned into a fuse.

5. The method of claim 1, wherein the using comprises matching the recorded physical design identification and the sigma code to the established and identified sigma code for the timing run and the established ring oscillator bins and respective code to set the voltage.

6. A system of optimizing semiconductor power by integration of physical design timing and product performance measurements, comprising a computing infrastructure operable to:
    establish identification performance/power bin codes and timing run codes;
    record a performance/power code at design test;
    record a timing code at design test; and
    match the establishing identification performance bin codes and timing run codes to the recorded performance code and timing code at second level assembly in order to adjust a voltage on card to an established timing code level using the established identification performance/power bin code and code for each identified timing run.

7. A method of optimizing semiconductor power by integration of physical design timing and product performance measurements for the design of a chip, comprising:
    establishing a timing run and identifying a sigma code for the timing run;
    establishing ring oscillator bins and respective code;
    identifying a required timing run for a level assembly to satisfy a selected voltage bin;
    timing a product using the required timing run;
    testing a ring oscillator of the product using the timing to obtain physical design identification;
    recording the physical design identification and the sigma code for the timing run;
    using the recorded physical design identification and the sigma code to set a voltage for the product to optimize power; and
    comparing the identification of the timing run and the ring oscillator bins and respective code to determine which oscillator bin to use for a particular timing run, wherein the using comprises matching the recorded physical design identification and the sigma code to the established and identified sigma code for the timing run and the established ring oscillator bins and respective code to set the voltage.

* * * * *